(12) United States Patent
Sekine

(10) Patent No.: US 7,430,036 B2
(45) Date of Patent: Sep. 30, 2008

(54) MASKLESS EXPOSURE APPARATUS USING OPTICAL MODULATOR, AND METHOD FOR MONITORING PATTERN GENERATING PERFORMANCE BY THE OPTICAL MODULATOR

(75) Inventor: Yoshiyuki Sekine, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 471 days.

(21) Appl. No.: 11/233,593

(22) Filed: Sep. 22, 2005

(65) Prior Publication Data

US 2006/0066829 A1 Mar. 30, 2006

(30) Foreign Application Priority Data

Sep. 24, 2004 (JP) .............................. 2004-278223

(51) Int. Cl.
G03B 27/54 (2006.01)
G03B 27/42 (2006.01)
G01B 9/02 (2006.01)
(52) U.S. Cl. ............................ 355/67; 355/53; 356/521
(58) Field of Classification Search ................ 355/53, 355/67, 77, 72, 75; 250/237 G; 356/446, 356/521, 399, 400, 401; 430/22, 30
See application file for complete search history.

(56) References Cited

U.S. PATENT DOCUMENTS 6,479,811 B1 * 11/2002 Kruschwitz et al. ..... 250/237 G

OTHER PUBLICATIONS

Solgaard et al, "Deformable grating optical modulator", Optics Letters, vol. 17, No. 9, May 1, 1992, pp. 688-690.
Goodman, Introduction to Fourier Optics, $2^{nd}$ ed.: ISBN 0-17-114257-6, pp. 210-215. 1996.

* cited by examiner

Primary Examiner—Peter B Kim
(74) Attorney, Agent, or Firm—Morgan & Finnegan, LLP

(57) ABSTRACT

A pattern monitoring method for an exposure apparatus that includes an optical modulator having at least one element that provides incident light with plural phase differences, and a projection optical system that uses first diffracted light among lights exited from the optical modulator to project a pattern onto an object to be exposed includes the steps of detecting second diffracted light having an order different from that of the first diffracted light among the lights exited from the optical modulator, and obtaining a state of the pattern projected onto the object based on a detection result by the detecting step.

7 Claims, 11 Drawing Sheets

PRIOR ART

PRIOR ART

MASKLESS EXPOSURE APPARATUS USING OPTICAL MODULATOR, AND METHOD FOR MONITORING PATTERN GENERATING PERFORMANCE BY THE OPTICAL MODULATOR

BACKGROUND OF THE INVENTION

The present invention relates generally to an exposure apparatus used to manufacture semiconductor integrated circuit ("IC") devices, etc., and more particularly to maskless exposure that dispenses with a photo-mask or reticle as an original. This invention is suitable for defect monitoring in an exposure apparatus that uses an optical modulator (also referred to as a spatial light modulator).

A projection exposure apparatus has been conventionally used to expose a mask pattern onto a substrate on which a photosensitive agent is applied in manufacturing a semiconductor device and a liquid crystal panel. However, as the finer processing to the mask pattern and a larger mask size are demanded with the improved integration and increased area of the device, an increase of the mask cost becomes problematic. Accordingly, the maskless exposure that dispenses with the mask for exposure has called attentions.

One exemplary attractive maskless exposure is a method for projecting a pattern image onto a substrate using a phase-modulation type optical modulator. The optical modulator is a parallel-connected type device, and the number of pixels per unit time may possibly be increased enormously. The phase modulation needs a minute displacement of a mirror, and thus is suitable for high-speed operation. In particular, a grating light valve ("GLV") type optical modulator that uses a modulated pattern of a diffraction grating is suitable for a large amount of data transfers, and a maskless exposure apparatus that transfers enormous data amount. The maskless exposure apparatus that uses the optical modulator instead of the mask to modulate the exposure light in accordance with a desired pattern, and condenses the pattern via a projection optical system, and forms the pattern on the substrate. GLV is disclosed, for example, in Optics Letters, Vol. 17, pp. 688-690 (1992).

Referring now to FIGS. 10A and 10B, a description will be given of an operational principle of a conventional GLV 20. Here, FIG. 10A shows a relationship between the section of the GLV 20 and a phase difference when the GLV 20 turns off. FIG. 10B shows a relationship between the section of the GLV 20 and a phase difference when the GLV 20 turns on.

Each element in the GLV 20 has a pair of catoptric bands or ribbons 21, and each pixel 23 includes three elements 22. The GLV 20 is a reflection-type phase modulator that has plural pixels 23 arranged in parallel. One of ribbons 21 in each element 22 is connected to a switch (not shown), and configured to vary its level, for example, when the voltage is applied to it.

In operation, when the switch turns off as shown in FIG. 10A, all the ribbons 21 have the same level. When the switch turns on, as shown in FIG. 10B, the ribbons 21 fall alternately by a quarter of the irradiation wavelength, and the reflected light have a phase difference of 180° between two adjacent ribbons 21. When the switch turns off, only the 0th order diffracted light is reflected since the reflected light is reflected while its phase is not modulated. On the other hand, when the switch turns on, the reflected light is phase-modulated and the ±1st order diffracted lights are reflected Referring now to FIG. 11A, a description will be given of control over the diffracted light using the GLV 20. Here, FIG. 11A is a schematic view for explaining the control over the diffraction light using the GLV 20. As shown in FIG. 11A, a filter 32 that blocks the 0th order light is provided between a lens 31 and the GLV 20. When the switch turns off, no light is incident upon the lens 31. When the switch turns on, the ±1st order diffracted lights are incident upon the lens 31. A maskless exposure apparatus that controls the exposure light is configured when it installs the GLB 20 instead of the mask and the lens 31 is regarded as the projection optical system.

Other prior art include J. W. Goodman, Introduction to Fourier Optics 2nd ed., ISBN 0-07-114257-6.

In the maskless exposure, the optical modulator generates a pattern instead of a mask pattern, and it is important to confirm whether the optical modulator properly generates the pattern. Of course, that the final device operates properly is a proof of the normal exposure. However, if the device does not work, it is difficult to identify whether the cause rests on the exposure or another process or thus to improve the yield. Therefore, it is preferable to confirm whether the optical modulator properly generates a pattern during the exposure.

There are roughly two causes that deteriorates the pattern generation, i.e., 1) an offset from a set pattern due to a data transfer error or a GLV's malfunction (this cause is referred to as a "defect" hereinafter); and 2) the light intensity shortage due to the contamination on the GLV (this cause is referred to as an "uneven screen light intensity" hereinafter). The defect results in the unexpected pattern generation and the light intensity shortage, and thus the final device is highly likely inoperable. The uneven screen light intensity appears as a critical dimension ("CD") scattering in the screen, and deteriorates the device performance. In particular, the reduced CD scattering is demanded strictly in the cutting-edge semiconductor device manufacturing technology, and the uneven screen light intensity should also be corrected for the future application of the maskless exposure apparatus to the state-of-the-art field.

When these causes occur during exposure, a check of the optical modulator and corrective or auxiliary exposure is needed if the defect or uneven screen light intensity is correctable. With a non-correctable defect, the disposal of the device is needed or the resist should be applied again to restart the exposure. It is necessary for the corrective exposure to know the information as to the level of the drop of the light intensity in the area that requires a correction, and the light intensity distribution in the overall exposure area. This information should be acquired at the exposure time for each exposure position.

BRIEF SUMMARY OF THE INVENTION

Accordingly, it is an exemplary object of the present invention to provide a pattern modulating method that monitors the uneven light intensity and defect during exposure in a maskless exposure apparatus that utilizes a phase modulation type optical modulator, and the exposure apparatus having that function.

A pattern monitoring method according to one aspect of the present invention for an exposure apparatus that includes an optical modulator having at least one element that provides incident light with plural phase differences, and a projection optical system that uses first diffracted light among lights exited from the optical modulator to project a pattern onto an object to be exposed includes the steps of detecting second diffracted light having an order different from that of the first diffracted light among the lights exited from the optical modulator, and obtaining a state of the pattern projected onto the object based on a detection result by the detecting step.

An exposure apparatus according to another aspect of the present invention includes an optical modulator having at least one element that provides incident light with plural phase differences, a projection optical system that uses first diffracted light among lights exited from the optical modulator to project a pattern onto an object to be exposed, a detector for detecting second diffracted light having an order different from that of the first diffracted light among the lights exited from the optical modulator, and an obtaining unit for obtaining a state of the pattern projected onto the object based on a detection result by the detector.

Other objects and further features of the present invention will become readily apparent from the following description of the preferred embodiments with reference to the accompanying drawings.

DETAILED DESCRIPTION OF THE PREFERRED EMBODIMENTS

With reference to the accompanying drawings, a description will be given of an optical modulator or GLV 120 that is applicable to the present invention and a maskless exposure apparatus 100 that utilizes the GLV 120. The GLV 120 normalizes the light intensity, and one pixel 121 has an invariable length that is the number of ribbons 123 multiplied by a width of each ribbon 123. A period in the pixel 121 is normalized to 2. Therefore, the ±1st order diffracted lights are generated at positions of ±0.5 on the Fourier transformation surface.

Figure 2A:
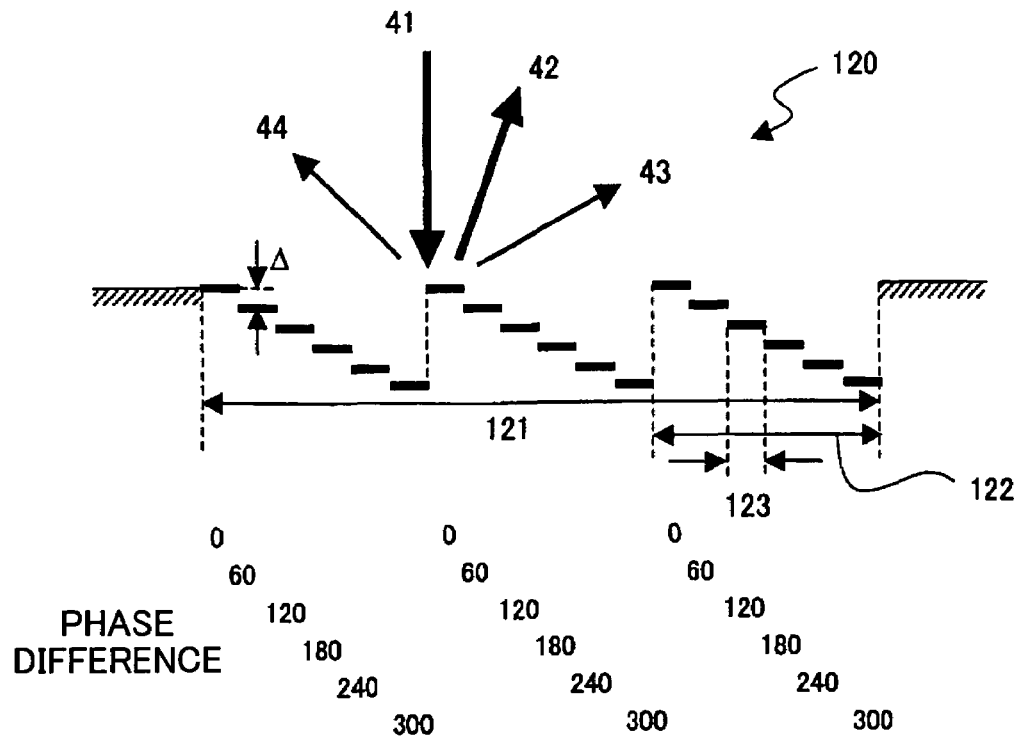
FIGS. 2A and 2B show a structure of the GLV applicable to the exposure apparatus shown in FIG. 1, and the light intensity distribution of the reflected light by the GLV.
Figure 2B:
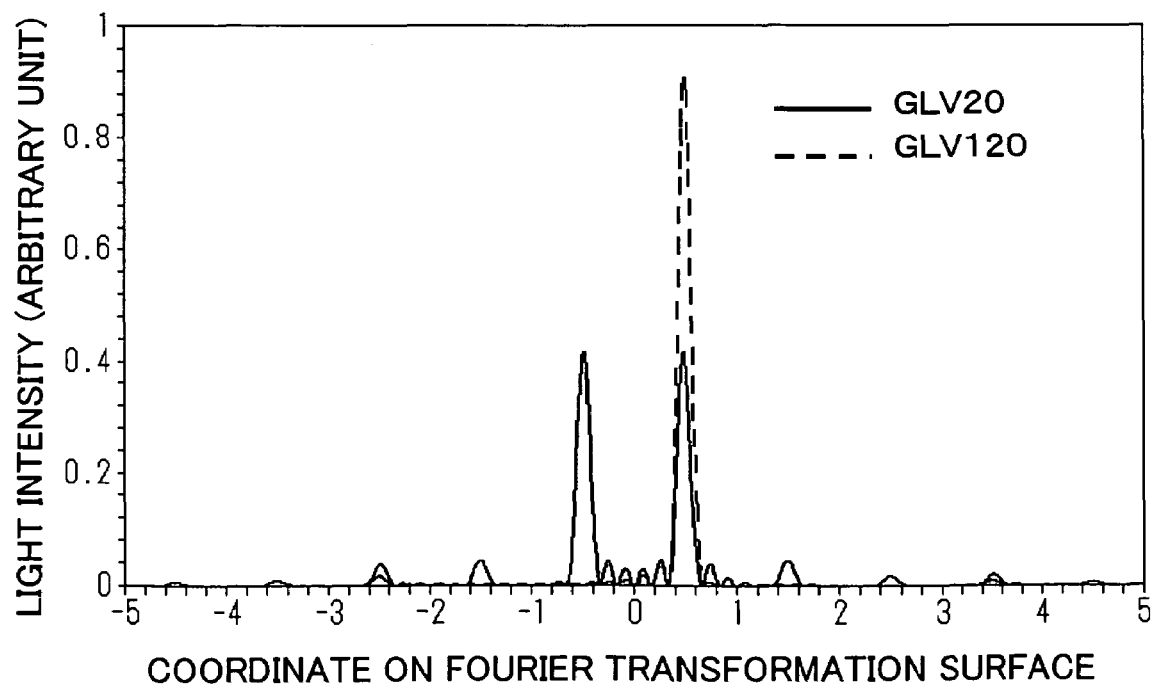
Figure 10A:
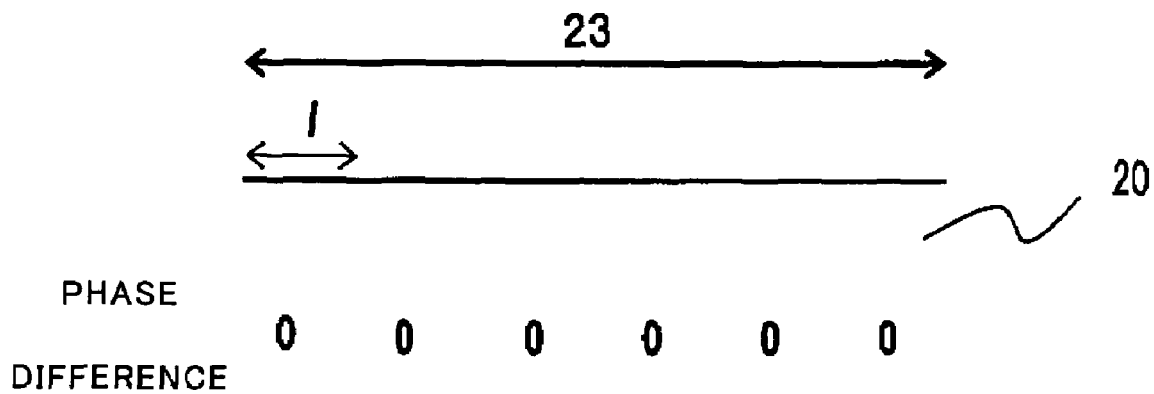
FIGS. 10A and 10B schematically show a structure and operation of the conventional GLV.
Figure 10B:
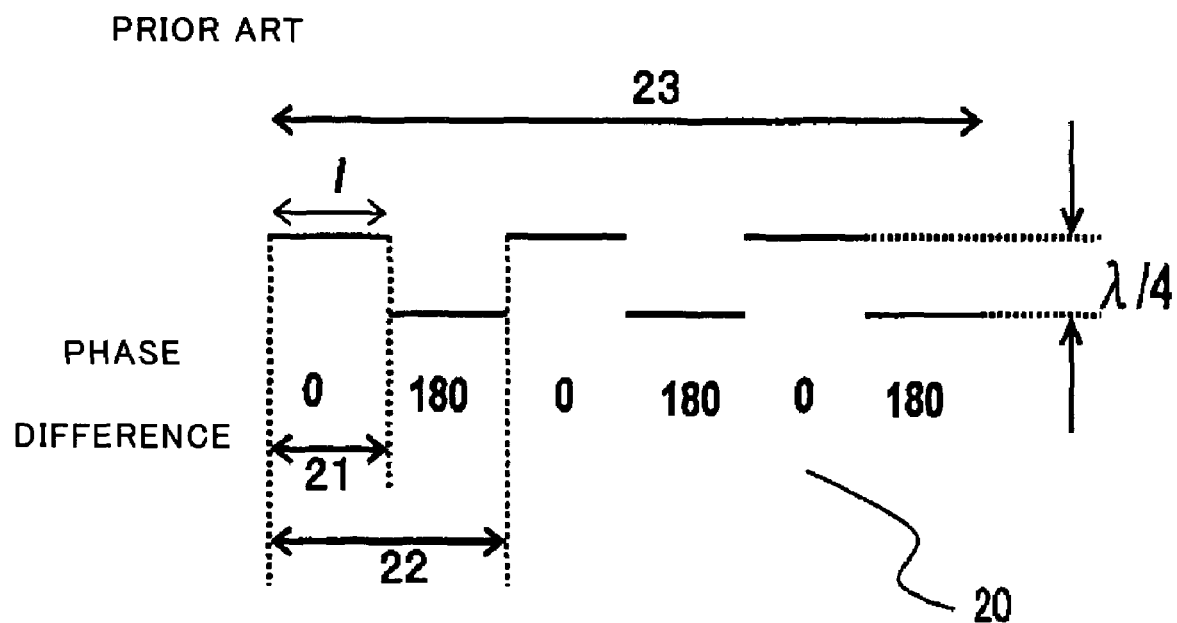

Referring now to FIG. 2, a description will be given of the GLV 120 according to one embodiment of the present invention. FIG. 2A shows a relationship between the section of the GLV 120 and the phase difference when the GLV 120 turns on. FIG. 2B shows a graph of the light intensity distribution of the reflected light, which compares the GLV 120 with the conventional GLV 20. When the GLV 120 turns off, a view corresponding to FIG. 2A is the same as FIG. 10A.

The GLV 120 has plural pixels 121, each pixel 121 having three elements 122. Each element 122 has six ribbons 123 that provide the reflected lights with phase differences of 0°, 60°, 120°, 180°, 240° and 300° in this order. Thus, this GLV 120 is a six-phase, three-period GLV. These phase differences are implemented, for example, by applying different voltages to each ribbon 123.

A displacement amount Δ in the ON state corresponds to the phase difference and is set to $\lambda/(2N)$, where N is the number of ribbons 123 included in each element 122, which is 6 in FIG. 2A, and λ is a wavelength of the incident light 41. When the incident light 41 is incident upon the GLV 120, the light intensity distribution of the reflected light includes, as shown in FIG. 2B, the 1st order diffracted light 42 but the intensity of the −1st order diffracted light is very weak. In addition, the GLV 120 generates the 7th order diffracted light 43 and the −5th order diffracted light 44. In the OFF state, no reflected, diffracted lights corresponds to ones 42 to 44, except for the 0th order diffracted light.

Thus, the GLV 120 gathers the light intensity on the +1st order diffracted light among the ±1st order diffracted lights in the ON state. This feature is preferable as described below with reference to FIGS. 11A and 11B.

Figure 11A:
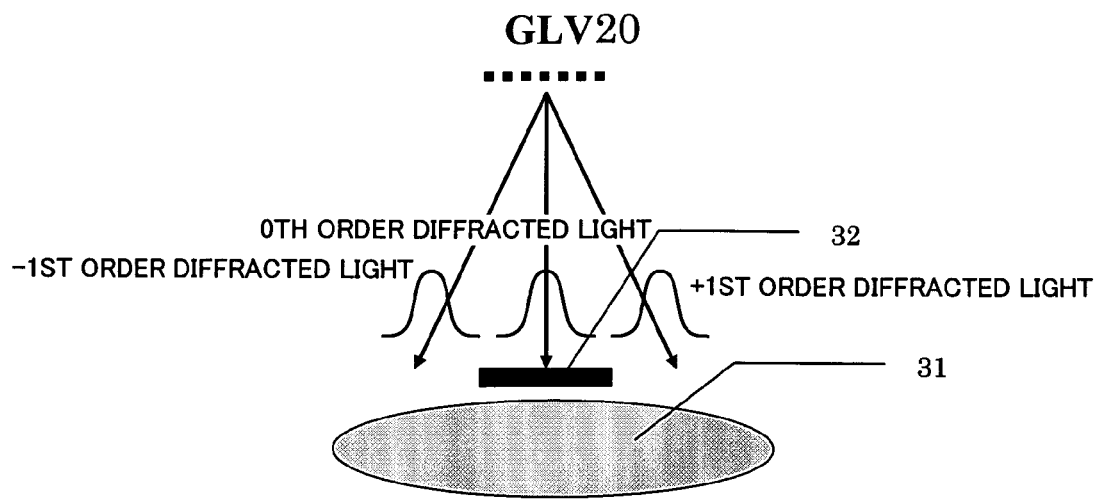
FIGS. 11A and 11B schematically show an optical system that controls an irradiation of the light utilizing the GLV shown in FIGS. 10A and 10B.
Figure 11B:
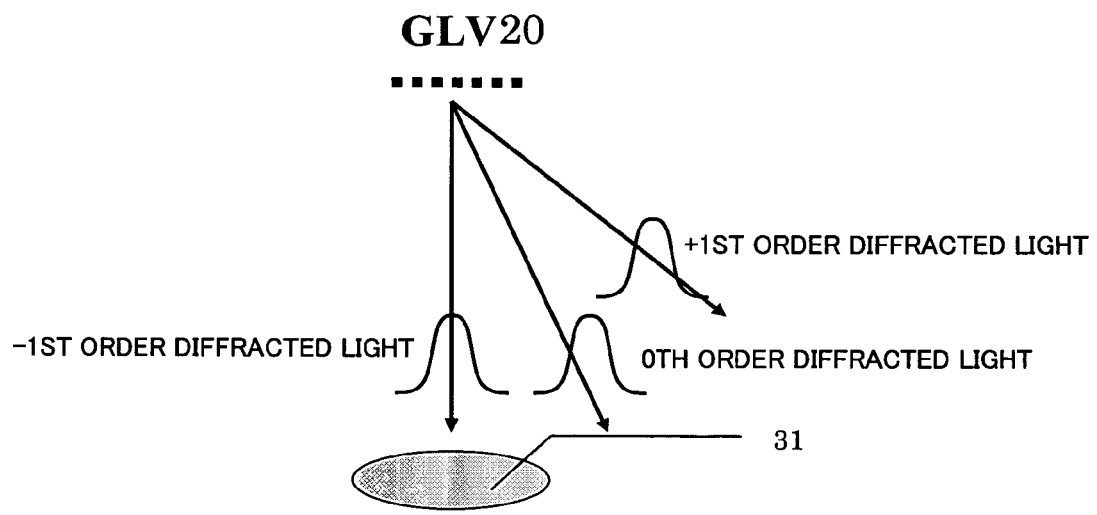

In the maskless exposure apparatus equipped with the GLV 20 shown in FIG. 11A, the projection optical system 31 should have a wide diameter to accept the ±1st order diffracted lights, causing a big apparatus. In addition, two lights incident upon the projection optical system 31 may interfere with each other and result in an unnecessary pattern. Accordingly, a combination of the GLV 20 and an oblique incident illumination is conceivable as shown in FIG. 11B. When the switch turns off, this configuration does not supply the light to the lens 31 since only the 0th order light occurs. In addition, when the switch turns on, the ±1st order diffracted lights occur and one of them, which is −1st order diffracted light in FIG. 11B, enters the lens 31 by adjusting the irradiation angle onto the GLV. As a result, a small size is enough for the projection optical system 31. In addition, only one light entering the projection optical system 31 realizes the high-quality exposure that resolves only a predetermined pattern. However, a problem of reduced exposure dose and thus lowered throughput occurs because one of the ±1st order diffracted lights is not used. The GLV 120 solves this problem, because even if the GLV 120 does not use the −1st order diffracted light but uses only the 1st order diffracted light, its light intensity loss is smaller than that of the GLV 20. Therefore, even if the 1st order diffracted light 42 is used for exposure, the GLV 120 prevents the throughput drop.

While 42 denotes the 1st order diffracted light, it may denote the −1st order diffracted light in some cases. This may vary according to the definition of the order and the direction of the coordinate system. Usually, it is unnecessary to distinguish the +1st order diffracted light from the −1st order diffracted light. As the displacement amount Δ increases, the light intensity of the higher order than the first order can increase, but the concentration or diffraction efficiency of the light intensity is usually lower than where the 1st order diffracted light has the highest light intensity. While the following description sets the 1st order diffracted light to the order for exposure use, this maintains the generalization.

When the GLV 120 turns on, the diffracted lights of other orders appear in addition to the 1st order diffracted light, although their diffraction efficiencies are small. The particularly important order is the (N×k+1)-th order light, which appears when $\Delta = \lambda/(2N)$, where N is the number of ribbons 123 in each element 122, and k is an arbitrary integer. The (N×k+1)-th order is referred to as the accompanying order.

FIG. 2A shows, as the accompanying orders closest to the first order, the −5th order diffracted light 44 and the 7th order diffracted light 43, where k corresponds to ±1. One of the characteristics of the accompanying order is, for example, that the diffraction efficiency of the accompanying order drops at the same ratio as the diffraction efficiency of the 1st order diffracted light 42 when one of the ribbons 123 is turned on in the element 122 but does not work. A contaminated pixel 121 decreases the entire reflectance but keeps the distribution of the diffraction efficiency between the first order diffracted light 42 and the light of the accompanying order, following the light intensity changes of the first order diffracted light. Utilizing this fact, the behavior of the light intensity of the first order diffracted light 42 used for exposure can be monitored by monitoring the light of the accompanying order.

When the light intensity of the first order diffracted light 42 can be monitored by monitoring the light of the accompanying order, the exposure failure is detectable but it is impossible to identify whether the failure results from the defect of the ribbon 123 in the pixel 121 or the contamination of the GLV 120. Therefore, both the first order diffracted light 42 and the diffracted light of the non-accompanying order should be monitored. The contaminated GLV 120 lowers the entire reflectance of the GLV 120 while maintaining the distribution of the diffraction efficiency between the first order diffracted light 42 and the light of the accompanying order. On the other hand, when the ribbon 123 does not work, the diffraction efficiencies of the first order diffracted light 42 and the light of the accompanying order lower while the diffraction efficiency of the light of the non-accompanying order increases. Hence, monitoring the light of the non-accompanying order leads to a detection of the defect of the GLV 120.

Monitoring of the order also plays an important role in an amplitude modulation by the GLV 120. In transferring a pattern in the semiconductor exposure apparatus, a mask often utilizes an auxiliary pattern that is too small to be resolved so as to enhance the resolution of a desired pattern. However, in the maskless exposure apparatus that utilizes the GLV 120, each pixel 121 has the same size in the GLV 120, and it is difficult to set such an auxiliary pattern. Since the auxiliary pattern generates the optically weak light, control over the light intensity of the diffracted light generated by the GLV 120 provides a substitute of the auxiliary pattern.

Figure 3A:
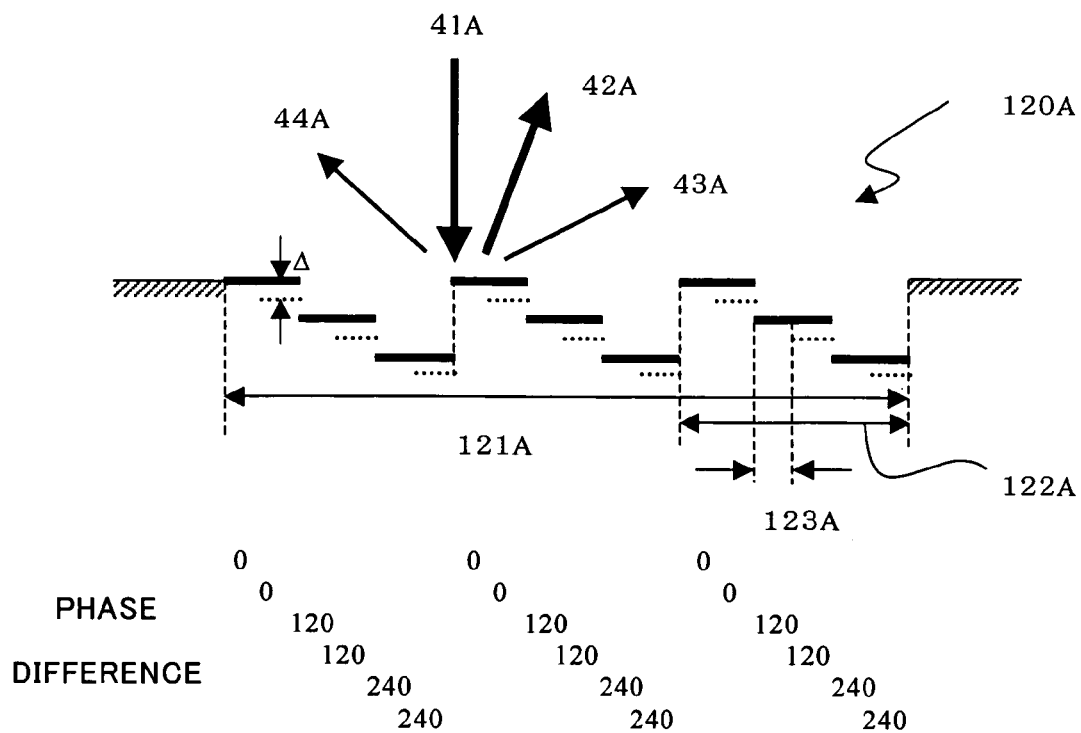
FIGS. 3A and 3B show a structure of a variation of the GLV shown in FIGS. 2A and 2B, and the light intensity distribution of the reflected light generated by the GLV.
Figure 3B:
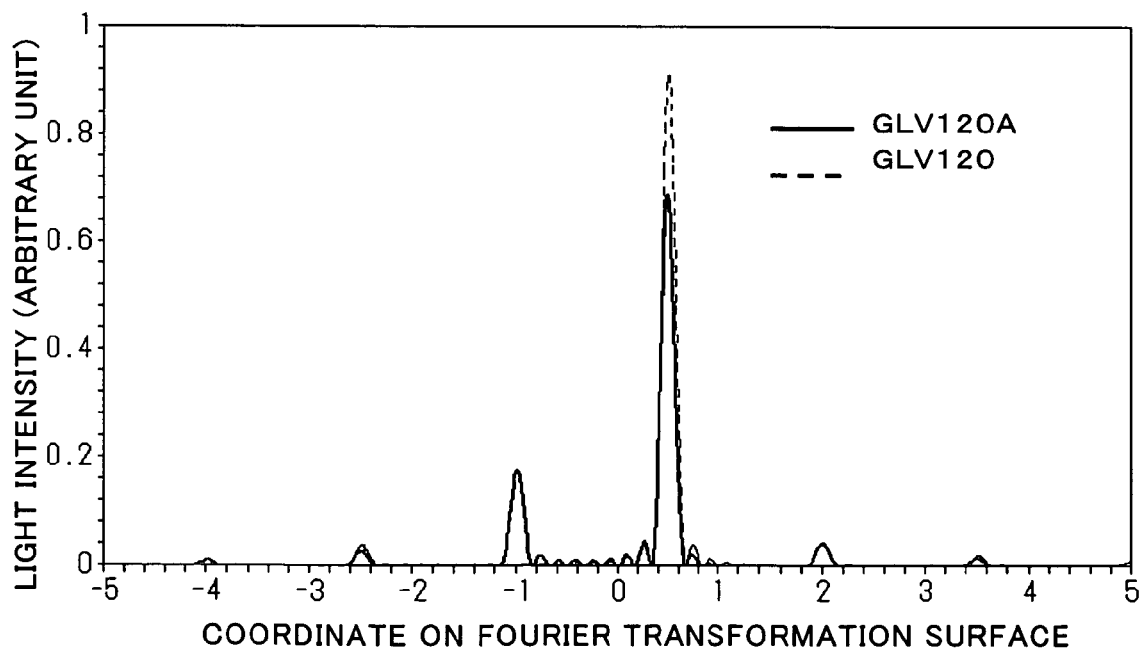

A GLV 120A shown in FIG. 3A can control the light intensity of the diffracted light. The GLV 120A has plural pixels 121A, each pixel 121A having three elements 122A. Each element 122A has six ribbons 123A that provide the reflected lights with phase differences of 0°, 0°, 120°, 120°, 240° and 240° in this order. Therefore, this GLV 120 is a six-phase, three-period GLV equivalent with a three-phase, three-period GLV. These phase differences are implemented, for example, by applying different voltages to each ribbon 123. FIG. 3B shows the light intensity distribution of the diffracted light that compares the GLV 120A with the GLV 120. It is understood that the light intensity of the first order diffracted light emitted from the GLV 120A is weaker than that emitted from the GLV 120.

The multistage GLV can vary the intensity of the diffracted light (which is referred to as an amplitude modulation) and produce the auxiliary pattern. The n-stage GLV is configured to provide a phase difference of (360/n) degrees between two adjacent ribbons in the pixel 121 where 0° is equivalent with 360°. Characteristically, continuous changes of the phase difference realize an arbitrary modulation between 0 and 1 where the ideal light intensity is set to 1. Clearly, a combination between the amplitude modulation and the phase modulation can realize a half-tone mask, i.e., a mask that maintains a constant light intensity in the background and a constant phase in the background.

In other words, the amplitude modulation is implemented by shifting a step $\Delta$ between two adjacent ribbons 123 from an ideal value $\lambda(2N)$. In this case, similar to a case where the ribbon 123 does not work, the reflected, diffracted lights occur irrespective of whether they are the accompanying order or the non-accompanying order. Since the light intensity or the diffraction efficiency of each of the first order diffracted light, and the lights of both the accompanying and non-accompanying orders can be calculated, the amplitude modulation can become more precise by monitoring the order other than the first order.

This fact can be led out when the GLV 120 is treated as a binary optics element ("BOE"). The BOE is disclosed in J. W. Goodman, Introduction to Fourier Optics 2nd ed., ISBN 0-07-114257-6. It is known that the diffraction efficiency of the light of the non-accompanying order increases even though $\Delta$ is set to an ideal value $\lambda(2N)$ if the ribbon 123 is approximately as wide as the wavelength $\lambda$ of the used light. This does not usually cause a problem, because the width of the ribbon 123 is set greater than the wavelength. However, even though it is as wide as the wavelength and the non-accompanying order appears remarkably, it can be corrected by previously measuring the light intensity generated.

First Embodiment

Figure 4:
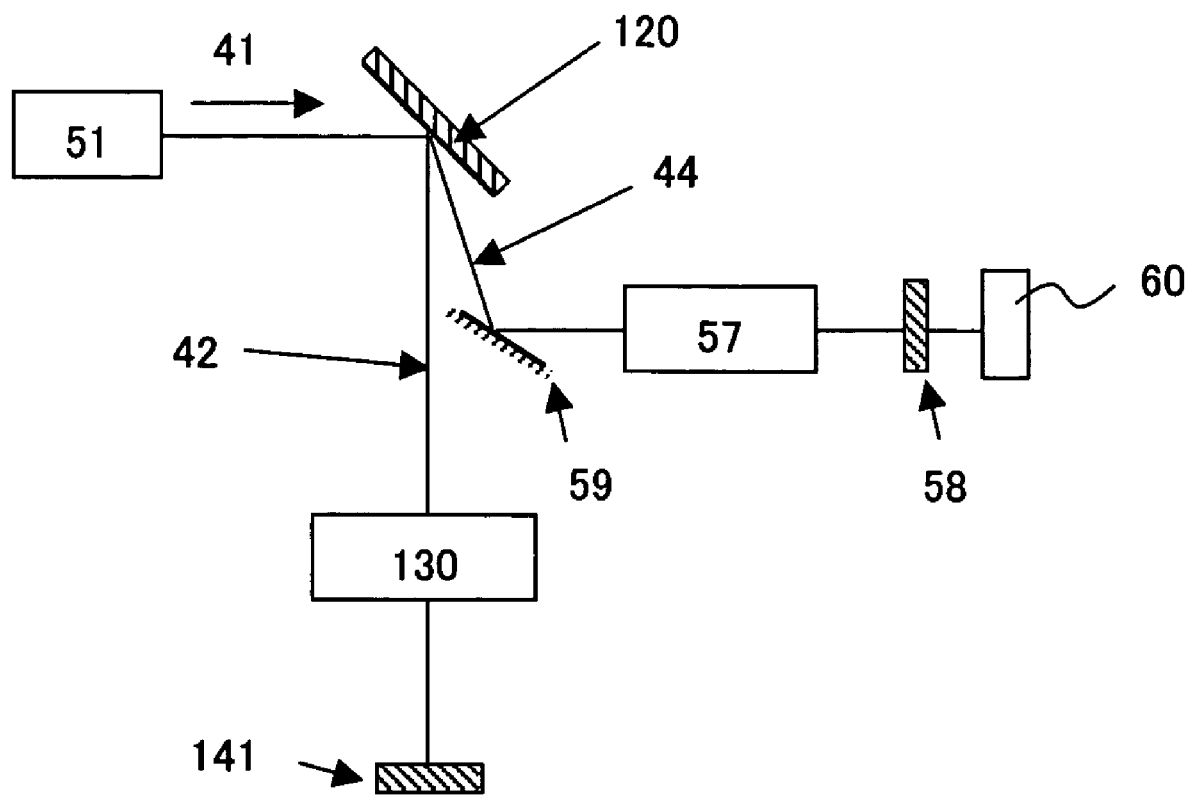
FIG. 4 is a schematic block diagram for explaining a first embodiment.
Figure 5:
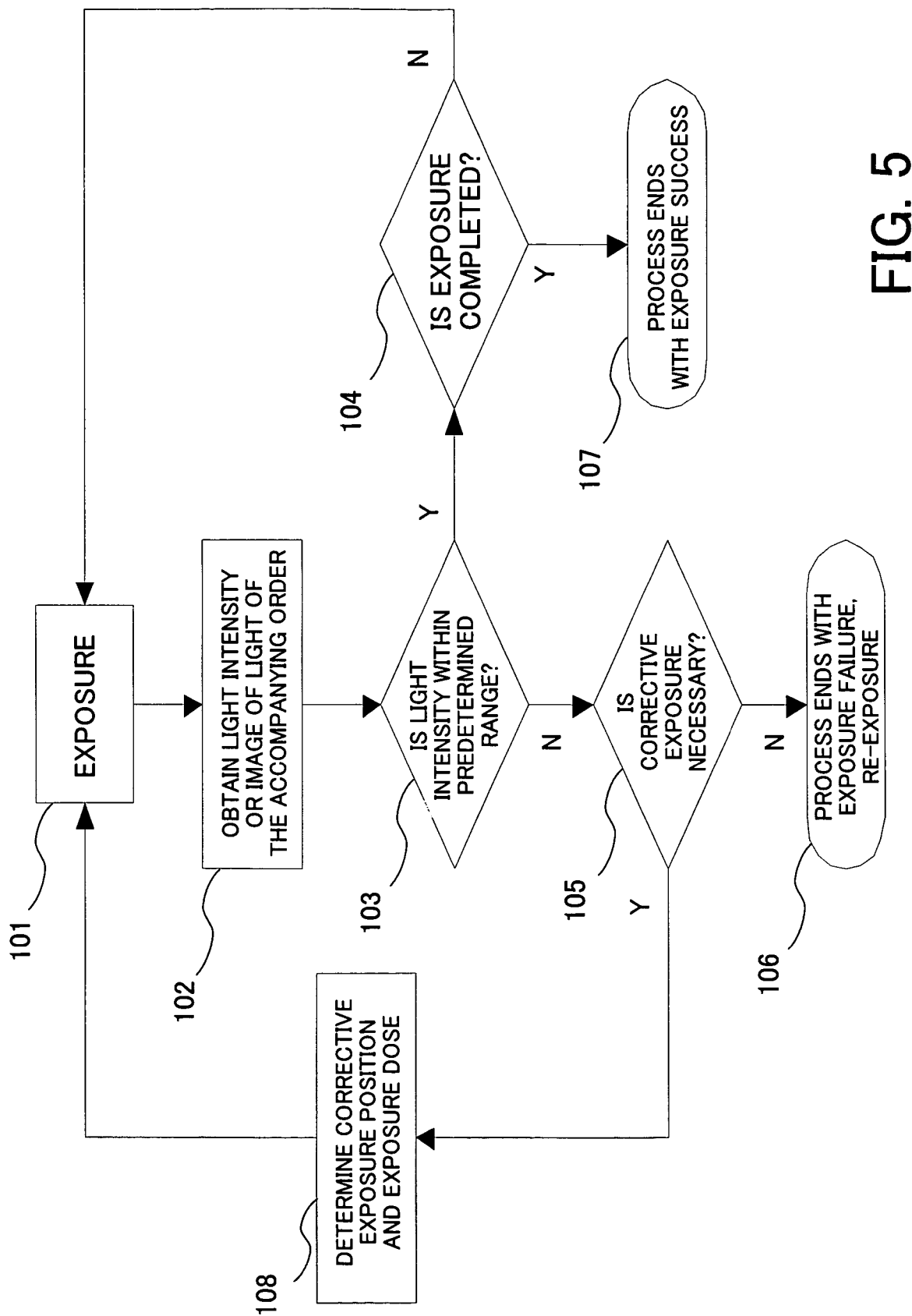
FIG. 5 is a flowchart for explaining an operation of a controller shown in FIG. 4.

Referring now to FIGS. 4 and 5, a description will be given of a monitoring method according to a first embodiment of the present invention. Here, FIG. 4 is a schematic block diagram of the first embodiment according to the present invention. FIG. 5 is a flowchart for explaining an operation of a controller 60 shown in FIG. 4.

The light emitted from an illumination light source 51 illuminates the GLV 120 shown in FIGS. 2A and 4. When the GLV 120 turns on, the GLV 120 generates the first order diffracted light (exposure light) 42 and the reflected, diffracted light 44 of the accompanying order that is not used for exposure. In general, the diffracted light having a smaller absolute value of the order has higher diffraction efficiency and thus is advantageous to monitoring. Therefore, this embodiment uses the −5th diffracted light 44 for the accompanying order rather than the 7th diffracted light 43.

The exposure light 42 is adapted to forms an image on an image surface 141 via the projection optical system 130.

On the other hand, the diffracted light of the accompanying order 44 has information equivalent with the exposure light 42 that is reflected and diffracted by the GLB 120. In order to monitor the diffracted light of the accompanying order 44, a diffraction mirror 59 separates its optical path from that of the exposure light 42, and then an optical system 57 forms its image on an image sensor 58. The pattern on the image sensor 58 is an image arising from the accompanying order but is equivalent with the image arising from the exposure light 42 on the image surface 141, when the optical system 57 has a sufficient resolving power. Therefore, the uneven screen light intensity and the effect on the image surface 141 can be detected by scrutinizing the pattern on the image sensor 58. The image sensor 58 is connected to the controller 60, and the controller 60 determines whether the GLV 120 properly generates the pattern properly, based on the detection result by the image sensor 58.

Referring now to FIG. 5, a description will be given of the determination process by the controller 60. Initially, the controller 60 instructs the illumination light source 51 to illuminate the GLV 120, whereby exposure transfers a pattern on the image surface 141 (step 101). At the same time, the controller 60 obtains, via the image sensor 58, information of the light intensity or image of the diffracted light of the accompanying order (step 102).

Based on the measurement result by the image sensor 58, the controller 60 compares the light intensity data or the image data stored in a memory (not shown) with the measurement result by the image sensor 58. Then, the controller 60 determines whether the light intensity distribution of the exposure light 42 falls within a predetermined range or a desired image is obtained (step 103). The controller 60 completes the exposure when determining that the light intensity distribution of the exposure light 42 falls within a predetermined range or a desired image is obtained (step 104), and ends the process with the exposure success (step 107).

On the other hand, when determining that the light intensity distribution of the exposure light 42 is outside the predetermined range or a desired image is not obtained (step 103), the controller 60 determines whether corrective or auxiliary exposure is needed (step 105). When the controller 60 determines that the corrective exposure does not provide a satisfactory result, the controller 60 ends the process with the exposure failure (step 106), and restarts the exposure. The corrective exposure does not provide a satisfactory result, for example, when an originally dark part is exposed or when the exposure dose excessively exceeds a predetermined value.

On the other hand, when determining that the corrective exposure will provide a satisfactory result (step 105), the controller 60 determines a necessary exposure dose to a position that needs the corrective exposure (step 108), and executes the conductive exposure (step 101).

While the controller 60 determines a detection result of the light intensity or image of the light of the accompanying order during the exposure in the above monitoring process, the memory (not shown) may store the measurement result of step 102 for use with steps 103 and 105.

While this embodiment uses a combination of the optical system 57 and image sensor 58 to monitor the light of the accompanying order, the monitoring method is not limited to use the image sensor, but may use a light intensity detector. Although the light intensity detector cannot provide a two-dimensional detection, a combination of time sharing of the light intensity detection and storage of the illumination position on the GLV 120 for each time provides the equivalent result to the two-dimensional detection.

The structure of the GLV 120 is not limited to one shown in FIG. 2A. For example, it may be the four-phase, one-period GLV in which four ribbons 123 provide phase differences of 0°, 90°, 180° and 270° and each pixel 121 has only one element 122. In addition, the GLV 120 may be the four-phase, two-period GLV in which four ribbons 123 provide phase differences of 0°, 90°, 180° and 270° and each pixel 121 has two elements 122. It is generally preferable to provide two or more displaceable ribbons that can three types of phase differences or more. Of course, the GLV 120 may be the three-phase, three-period GLV in which three ribbons 123 provide phase differences of 0°, 120° and 240° and each pixel 121 has three elements 122. This is because, in general, as the type number of the phase difference increases, the intensity of the diffracted light for exposure use can be relatively enhanced. As N becomes excessively large, a production of the GLV 120 becomes difficult. Therefore, a proper N is between 2 and 6.

Second Embodiment

Figure 6:
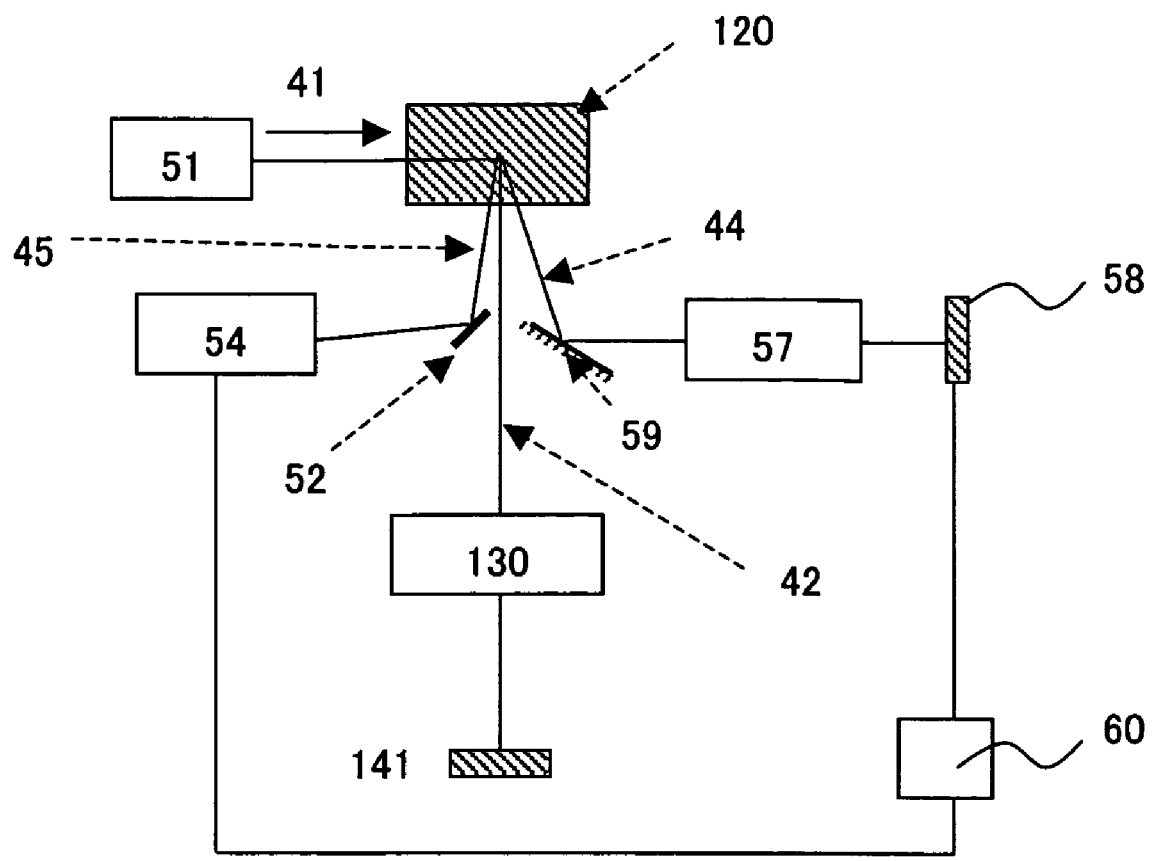
FIG. 6 is a schematic block diagram for explaining a second embodiment.
Figure 7:
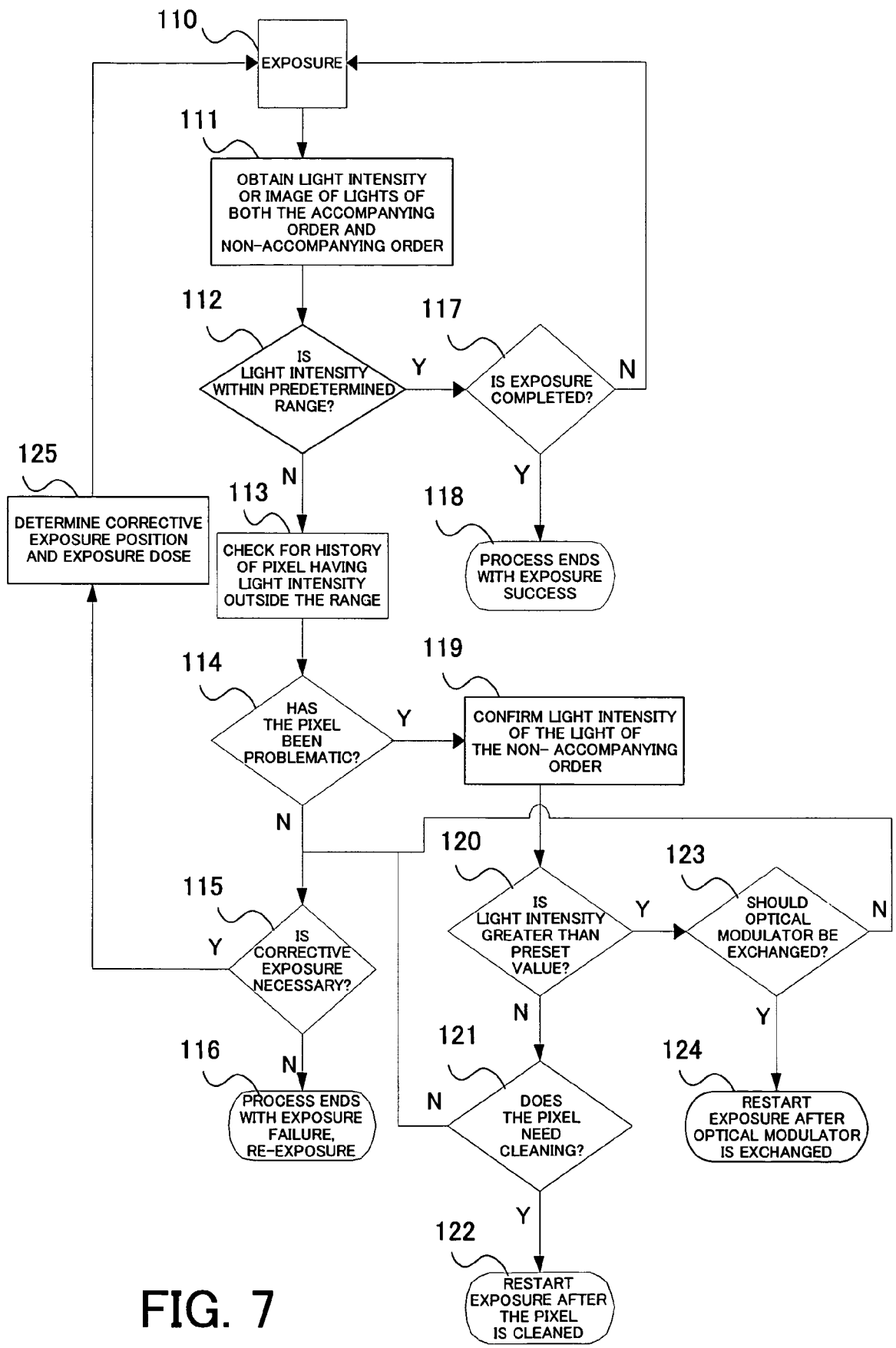
FIG. 7 is a flowchart for explaining an operation of a controller shown in FIG. 6.

Referring now to FIG. 6, a description will be given of a monitoring method according to a second embodiment of the present invention. Here, FIG. 6 is a schematic block diagram of the second embodiment according to the present invention. FIG. 7 is a flowchart for explaining an operation of the controller 60 shown in FIG. 6.

The light emitted from an illumination light source 51 illuminates the GLV 120. While the GLV 120 of this embodiment has the structure shown in FIG. 2A, it may have another structure as described above. The GLV 120 generates the first order diffracted light (exposure light) 42 used for exposure, the reflected, diffracted light 44 of the accompanying order among the lights that are not used for exposure, and the reflected, diffracted light 45 of the non-accompanying order, such as the fourth order. While the light of the non-accompanying order includes the 0th order light or regularly reflected light, the 0th order light is undesirable since it is incident even in the OFF state and has a difficulty to be separated from the exposure light. Use of the light between the −N-th order and the N-th order is suitable, because the light of the order outside this range has much smaller light intensity changes than the displacements of the ribbon 123 and it is difficult to measure the changes as illustrated in FIGS. 2B and 3B. For light separation purposes, it is preferable to use the negative order when the accompanying order k=1, and the positive order when the accompanying order k=−1.

The exposure light 42 is adapted to forms an image on an image surface 141 via the projection optical system 130.

On the other hand, the diffracted light of the accompanying order 44 has information equivalent to the exposure light 42 that is reflected and diffracted by the GLB 120. In order to monitor the diffracted light of the accompanying order 44, the diffraction mirror 59 separates its optical path from that of the exposure light 42, and the optical system 57 forms its image on the image sensor 58. The pattern on the image sensor 58 is an image arising from the accompanying order but is equivalent with the image arising from the exposure light 42 on the image surface 141, when the optical system 57 has a sufficient resolving power. Therefore, the uneven screen light intensity and the effect on the image surface 141 can be detected by scrutinizing the pattern on the image sensor 58.

A deflection mirror 52 separates the optical path of the monitoring light 45 of the non-accompanying order from those of the exposure light 42 and the light of the accompanying order, and the monitoring light 45 enters a light intensity sensor 54. The diffracted light 45 occurs when the GLV 120 turns on but the ribbon 123 in the pixel 121 does not work expectedly. Therefore, by measuring the diffracted light 45 simultaneously with the diffracted light 44 or 43, whether or not each pixel 121 in the GLV 120 properly works can be determined. Even for the amplitude modulation by the GLV 120, the modulated light intensity can be tracked by measuring the light of the accompanying order 44. The simultaneous measurement of the light of the non-accompanying order improves its precision.

The light intensity sensor 54 and the image sensor 58 are connected to the controller 60, and whether the GLV 120 properly generates the pattern properly is determined based on the detection result by the controller 60 and the image sensor 58.

Referring now to FIG. 7, a description will be given of the determination process by the controller 60. Initially, the controller 60 instructs the illumination light source 51 to illuminate the GLV 120, whereby exposure transfers a pattern on the image surface 141 (step 110). At the same time, the controller 60 obtains, via the image sensor 58 and the light intensity sensor 54, information of the light intensity or image of each of the diffracted lights 44 and 45 (step 111).

Based on the measurement result by the image sensor 58, the controller 60 compares the light intensity data or the image data stored in a memory (not shown) with the measurement result by the image sensor 58. Then, the controller 60 determines whether the light intensity distribution of the exposure light 42 is within a predetermined range or a desired image is obtained (step 112). The controller 60 completes the exposure when determining that the light intensity distribution of the exposure light 42 is within a predetermined range or a desired image is obtained (step 117), and ends the process with the exposure success (step 118).

On the other hand, when the controller 60 determines that the light intensity distribution of the exposure light 42 is outside the predetermined range or a desired image is not obtained (step 112), the controller 60 checks for the determination history of the light intensity of the pixel 121 corresponding to the position that is determined to have the light intensity outside the range (step 113). Referring to this history, the controller 60 determines whether the pixel 121 has posed a problem of the light intensity (step 114).

When the controller 60 determines that the pixel 121 has never posed a problem of the light intensity, then the controller 60 determines whether corrective or auxiliary exposure is needed (step 115). When the controller 60 determines that the corrective exposure does not provide a satisfactory result, the controller 60 ends the process with the exposure failure (step 116), and redoes the exposure. The corrective exposure does not provide a satisfactory result, for example, when an originally dark part is exposed or when the exposure dose excessively exceeds a predetermined value.

On the other hand, when the controller 60 determines that the corrective exposure will provide a satisfactory result (step 115), the controller 60 determines a necessary exposure dose to a position that needs the corrective exposure (step 125), and executes the conductive exposure (step 110).

On the other hand, when the controller 60 determines that the pixel 121 has posed a problem of the light intensity (step 114), then the controller 60 confirms the light intensity of the diffracted light 45 of the non-accompanying order (step 119). Next, the controller 60 determines whether the light intensity of the diffracted light 45 is greater than the preset value (step 120).

When the controller 60 determines that the light intensity of the diffracted light 45 is less than the preset value (step 120), the controller 60 concludes that the pixel 121 is contaminated and further determines whether it is necessary to clean the GLV 120 (step 121). When the controller 60 determines that cleaning is necessary (step 121), then the controller 60 interrupts the exposure process, cleans the pixel and restarts the exposure (step 122). On the other hand, when the controller 60 determines that cleaning is unnecessary (step 121), the procedure moves to step 115.

Usually, the corrective exposure handles the lowered intensity of the exposure light 42 due to the contaminated pixel. However, cleaning is necessary when the throughput remarkably drops, for example, where the intensity at the pixel is much lower than the intensities at the surrounding pixels, where the number of pixels having lowered intensities increases, where the corrective exposure requires a long time, where the intensity of the overall pixel 121 become much lower than that of the overall pixel 121 just after the installation time. The illustrative drop of the throughput is 30%, although the drop depends upon an object to be exposed.

When the controller 60 determines that the light intensity of the diffracted light 45 is greater than the preset value (step 120), the controller 60 concludes that the ribbon 123 in the pixel 121 is defective and further determines whether the GLV 120 should be exchanged (step 123). Determining that exchange is necessary (step 123), the controller 60 restarts the exposure after the GLV 120 is exchanged (step 124). On the other hand, when the controller 60 determines that exchange is unnecessary (step 123), the procedure moves to step 115. In step 123, the controller 60 contemplates each ribbon 123 for a determination of contamination, rather than each pixel 121. Preferably, the light intensity is checked after exchange to separate the issue of contamination of the ribbon 123 from an issue of inoperability of the ribbon 123. The number of exchanges of the GLV 120 should be maintained minimum. The corrective exposure can handle the lowered intensity of the exposure light. The exchange is selected when the exposure light 42 has predetermined intensity or greater in the OFF state, similar to a generation of flare, such as 5% of the intensity in the ON state, although the predetermined intensity depends upon the exposure condition and the object to be exposed.

While the controller 60 determines a detection result of the light intensity or image of the light of the accompanying order during the exposure in the above monitoring process, the memory (not shown) may store the measurement result of step 111 for use with steps 115 and 117.

While this embodiment uses a combination of the optical system 57 and image sensor 58 to monitor the light 44 of the accompanying order, and the light intensity sensor 54 to monitor the monitoring light 45 of the non-accompanying light. However, the monitoring method is not limited to this embodiment, but may use a light intensity sensor to monitor the light of the accompanying order and the image sensor to monitor the light of the non-accompanying order.

Third Embodiment

Figure 1:
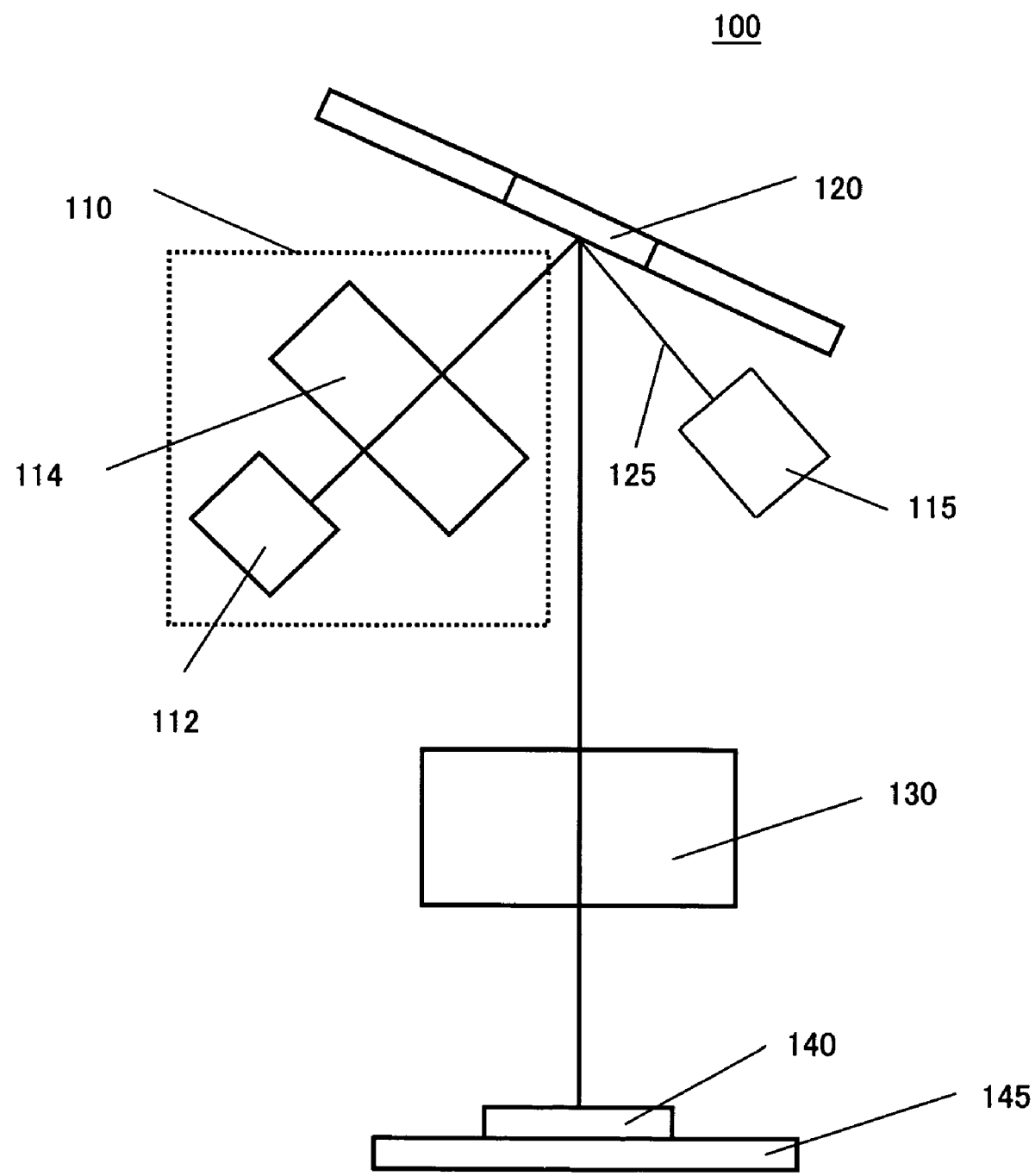
FIG. 1 is a schematic block diagram of an exposure apparatus according to one embodiment of the present invention.

Referring now to FIG. 1, a description will be given of the maskless exposure apparatus 100 that has the inventive method for monitoring the uneven screen light intensity and defect. Here, FIG. 1 is a schematic block diagram of the illustrative exposure apparatus 100 according to the present invention. The exposure apparatus 100 includes, as shown in FIG. 1, an illumination apparatus 110 that illuminates the GLV 120, an optical system 115 that monitors the lights of the accompanying order and the non-accompanying order, a projection apparatus 130 that projects onto a plate 140 the diffracted light generated from the illuminated GLV 120, a stage 145 that supports the plate 140.

The exposure apparatus 100 is suitable for a submicron or quarter-micron lithography process, and this embodiment discusses a step-and-scan exposure apparatus (also referred to as a "scanner"). The "step-and-scan manner", as used herein, is an exposure method that exposes a pattern onto a wafer by continuously scanning the wafer relative to the GLV, and by moving, after a shot of exposure, the wafer stepwise to the next exposure area to be shot.

The illumination apparatus 110 illuminates the GLV 120 that is controlled in accordance with a circuit pattern to be transferred, and includes a light source section 112 and an illumination optical system 114.

The light source section 112 uses, for example, a light source such as an ArF excimer laser with a wavelength of approximately 193 nm, a KrF excimer laser with a wavelength of approximately 248 nm, and an an $F_2$ laser having a wavelength of about 157 nm. However, the type of the light source is not limited or the number of light sources is not limited. When using a laser, the light source section 112 preferably uses a light shaping optical system that turns the collimated light from the laser light source into a desired beam shape, and an incoherently turning optical system that turns a coherent laser beam into an incoherent one.

The illumination optical system 114 is an optical system that illuminates the GVL 120, and includes a lens, a mirror, an optical integrator, a stop and the like, for example, a condenser lens, a fly-eye lens, an aperture stop, a condenser lens, a slit, and an imaging optical system in this order. The illumination optical system 114 can use any light regardless of whether it is axial or non-axial light. The light integrator may include a fly-eye lens or an integrator formed by stacking two sets of cylindrical lens array plates (or lenticular lenses), and can be replaced with an optical rod or a diffractive optics.

The GLV 120 whose switch is electrically turned on and off from the outside controls the diffracted light, and is supported and driven by a stage (not shown). Among the diffracted lights emitted from the GLV 120, the first order diffracted light 42 for transfer is projected onto the plate 140 through the projection optical system 130. The GLV 120 and the plate 140 have an optically conjugate relationship. Since the exposure apparatus 100 of this embodiment is a scanner, the GLV 120 repeats turning on and off while the exposure apparatus scans the plate 140 at a speed ratio corresponding to a reduction ratio, transferring the pattern of the GLV 120 onto the plate 140.

Among the diffracted lights emitted from the GLV 120, the light 125 (or lights 43 to 45) used for monitoring is monitored by the optical system 115 that has an observation means, such as a light intensity sensor or an image sensor. The monitoring light 125 may be the light of the accompanying order and/or the light of the non-accompanying order, although FIG. 1 shows only one monitoring light. In case of the accompanying order, the suitable order for the monitoring light 125 is close to the first order diffracted light 42 and has a high diffraction efficiency, such as −5th order when the number N of ribbons 121 in each element 122 is 6. Of course, this is not the case depending upon the specification and capability of the sensor. In monitoring the diffracted light 45 of the non-accompanying order, the suitable order is one that facilitates splitting of the optical path.

The projection optical system 130 is an optical system may use a dioptric optical system that includes only plural lens elements, a catadioptric optical system comprised of a plurality of lens elements with at least one concave mirror, and a catoptric optical system including only mirrors, and so on. Any necessary correction of a chromatic aberration in the projection optical system 130 can use a plurality of lens elements made from glass materials having different dispersion or Abbe values, or arrange a diffraction optical element such that it disperses in a direction opposite to that of the lens element.

The plate 140 is an exemplary object to be exposed, such as a wafer and a LCD, and photoresist is applied to the plate 230. A photoresist application step includes a pretreatment, an adhesion accelerator application treatment, a photoresist application treatment, and a pre-bake treatment. The pretreatment includes cleaning, drying, etc. The adhesion accelerator application treatment is a surface reforming process so as to enhance the adhesion between the photoresist and a base (i.e., a process to increase the hydrophobicity by applying a surface active agent), through a coat or vaporous process using an organic film such as HMDS (Hexamethyl-disilazane) The pre-bake treatment is a baking (or burning) step, softer than that after development, which removes the solvent.

The stage 145 supports the plate 140. The stage 145 may use any structure known in the art, and a detailed description of its structure and operations will be omitted. For example, the stage 145 uses a linear motor to move the plate 140 in the XY directions orthogonal to the optical axis. The GLV 120 and plate 140 are, for example, scanned synchronously, and positions of the GLV stage (not shown) and stage 145 are monitored, for example, by a laser interferometer and the like. The GLV 120 is turned on and off in accordance with driving of the stage 145. The stage 145 is installed on a stage stool supported on the floor and the like, for example, via a damper. The GLV stage and the projection optical system 130 are provided, for example, on a barrel stool (not shown) that is supported on a base frame placed on the floor, for example, via a damper.

In exposure, the light emitted from the light source section 112, for example, Koehler-illuminates the GLV 120 through the illumination optical system 114. The light that has been reflected by the GLV 120 and reflects the pattern forms an image on the plate 140 through the projection optical system 130. The GLV 120 in the exposure apparatus 100 does not restricts the NA or loses the light intensity. Therefore, the exposure apparatus 100 can provide high-quality devices (such as semiconductor devices, LCD devices, image pick-up devices (such as CCDs), and thin film magnetic heads) with excellent work efficiency.

Figure 8:
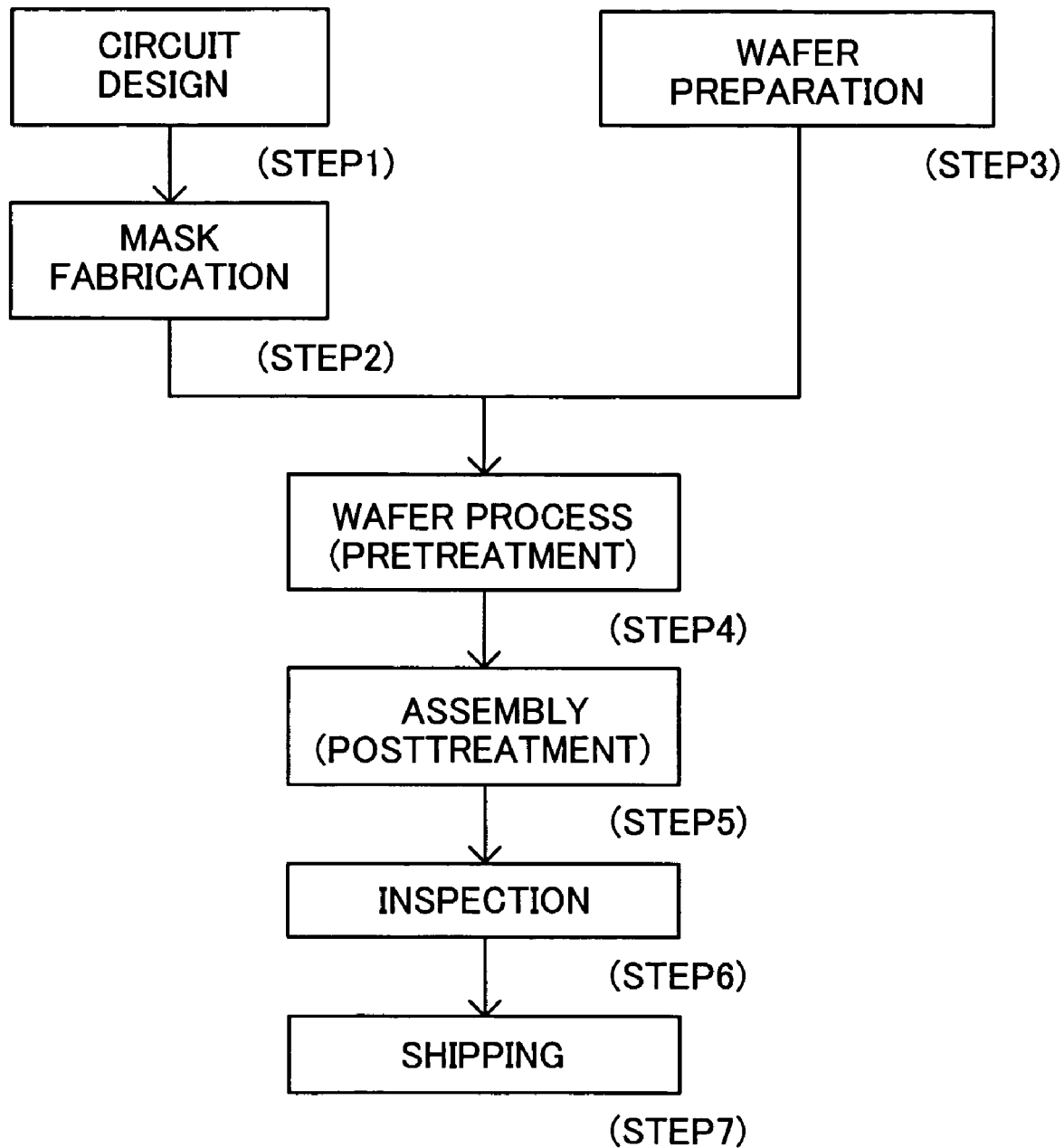
FIG. 8 is a flowchart for explaining a method for fabricating devices (semiconductor chips such as ICs, LSIs, and the like, LCDs, CCDs, etc.).
Figure 9:
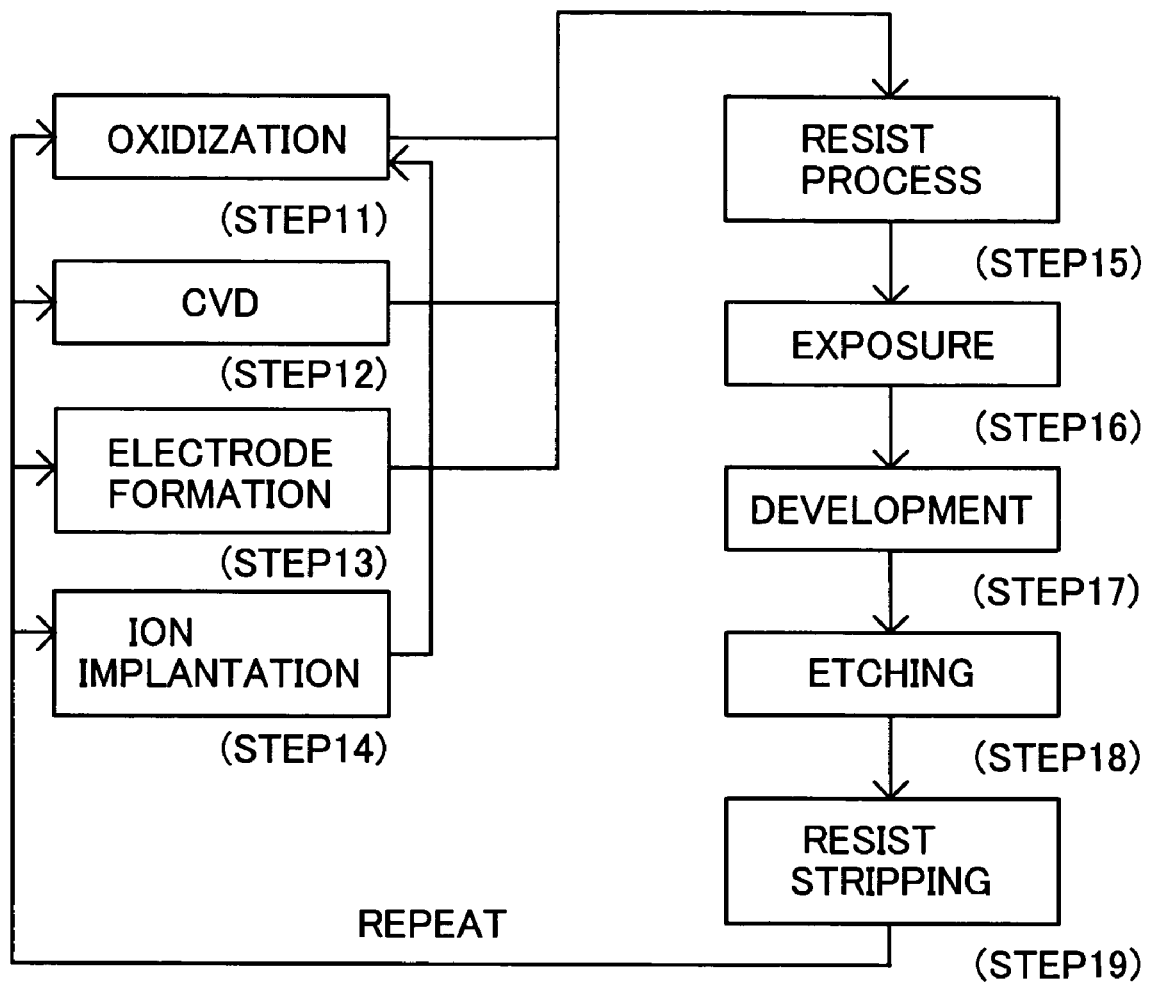
FIG. 9 is a detailed flowchart for Step 3 of wafer process shown in FIG. 8.

Referring now to FIGS. 8 and 9, a description will now be given of an embodiment of a device manufacturing method using the above exposure apparatus 100. FIG. 8 is a flowchart for explaining a fabrication of devices (i.e., semiconductor chips such as IC and LSI, LCDs, CCDs, etc.). Here, a description will be given of a fabrication of a semiconductor chip as an example. Step 1 (circuit design) designs a semiconductor device circuit. Step 2 (mask fabrication) sets the GLV operation during exposure or an input signal to the GLV in order to form a designed circuit pattern. Step 3 (wafer preparation) manufactures a wafer using materials such as silicon. Step 4 (wafer process), which is referred to as a pretreatment, forms actual circuitry on the wafer through photolithography using the GLV and wafer. Step 5 (assembly), which is also referred to as a posttreatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 9 is a detailed flowchart of the wafer process in step 4. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ions into the wafer. Step 15 (resist process) applies a photosensitive agent onto the wafer. Step 16 (exposure) uses the exposure apparatus 100 to expose a circuit pattern formed by the GLV onto the wafer. Step 17 (development) develops the exposed wafer. Step 18 (etching) etches parts other than a developed resist image. Step 19 (resist stripping) removes disused resist after etching. These steps are repeated, and multilayer circuit patterns are formed on the wafer. This device manufacturing method can manufacture higher-quality devices than the conventional method without a mask.

Furthermore, the present invention is not limited to these preferred embodiments and various variations and modifications may be made without departing from the scope of the present invention.

The present invention thus enables the optical modulator's defect and the uneven screen light intensity at the projection time to be observed in the maskless exposure apparatus that does not use a mask as an original, thereby promoting a development of an exposure apparatus that reconciles both the cost reduction and throughput of the device.

This application claims a foreign priority benefit based on Japanese Patent Applications No. 2004-278223, filed on Sep. 24, 2004, which is hereby incorporated by reference herein in its entirety as if fully set forth herein.

What is claimed is:

1. A pattern monitoring method for an exposure apparatus that includes an optical modulator having at least one element that provides incident light with plural phase differences, and a projection optical system that uses first diffracted light among lights exited from the optical modulator to project a pattern onto an object to be exposed, said pattern monitoring method comprising the steps of:

detecting second diffracted light having an order different from that of the first diffracted light among the lights exited from the optical modulator; and obtaining a state of the pattern projected onto the object based on a detection result by said detecting step, wherein the order of the second diffracted light is N×k+m, where m is the order of the first diffracted light, N is the number of light reflective bands included in each element, and k is an arbitrary integer.

2. A pattern monitoring method according to claim 1, wherein said detecting step detects the second diffracted light of plural types of orders, and the plural types of orders include N×k+m and one other than N×k+m, where m is the order of the first diffracted light, N is the number of light reflective bands included in each element, and k is an arbitrary integer.

3. A pattern monitoring method according to claim 2, wherein m is one of 1 and −1 and k is one of −1 and 1.

4. A pattern monitoring method according to claim 2, wherein m is one of 1 and −1, k is one of −1 and 1, and the order other than N×k+m is between −N and N.

5. A pattern monitoring method according to claim 2, wherein N is between 2 and 6.

6. A pattern monitoring method according to claim 1, wherein m is one of 1 and −1 and k is one of −1 and 1.

7. A pattern monitoring method according to claim 1, wherein N is between 2 and 6.

* * * * *